United States Patent
Mühling

[11] Patent Number: 5,878,394
[45] Date of Patent: Mar. 2, 1999

[54] PROCESS AND DEVICE FOR THE SPEECH-CONTROLLED REMOTE CONTROL OF ELECTRICAL CONSUMERS

[75] Inventor: Frank Mühling, Wildegg, Switzerland

[73] Assignee: Info Byte AG, Egliswil, Switzerland

[21] Appl. No.: 722,181

[22] PCT Filed: Mar. 2, 1995

[86] PCT No.: PCT/CH95/00047

§ 371 Date: Oct. 16, 1996

§ 102(e) Date: Oct. 16, 1996

[87] PCT Pub. No.: WO95/29481

PCT Pub. Date: Nov. 2, 1995

[30] Foreign Application Priority Data

Apr. 21, 1994 [CH] Switzerland .............................. 1240/94

[51] Int. Cl.⁶ .................................. G10L 3/00; H04B 1/16
[52] U.S. Cl. ........................................ 704/275; 455/151.4
[58] Field of Search .................................. 704/270, 274; 455/151.4, 151.1, 151.2, 352, 353; 348/734

[56] References Cited

U.S. PATENT DOCUMENTS

| | | | |
|---|---|---|---|
| 4,718,112 | 1/1988 | Shinoda ................................. | 455/151 |
| 5,199,080 | 3/1993 | Kimura et al. .......................... | 704/275 |
| 5,204,768 | 4/1993 | Tsakiris et al. ........................ | 359/148 |
| 5,226,090 | 7/1993 | Kimura ................................. | 704/275 |
| 5,247,580 | 9/1993 | Kimura et al. .......................... | 704/275 |
| 5,255,313 | 10/1993 | Darbee ................................. | 379/102 |
| 5,267,323 | 11/1993 | Kimura ................................. | 704/275 |

*Primary Examiner*—David R. Hudspeth
*Assistant Examiner*—Patrick N. Edouard
*Attorney, Agent, or Firm*—Anderson, Kill & Olick, P.C.

[57] ABSTRACT

The invention pertains to a process and a device for the speech-controlled remote control of electrical consumers by means of speech commands entered via a standard, commercially available PC (1). The PC (1) stores the control sequences for the sequencing control of the individual electrical consumers (21, 22, 23, 24, . . . , 2n). The control sequences are infrared-encoded signals enabling any electrical consumers featuring an infrared remote control unit to be controlled. Units which do not feature a remote control unit can be at least switched on and off via an upstream infrared receiver. A graphical user interface which is capable of being displayed on a monitor of the PC (1) forms an image display which is assigned to each individual electrical consumer, said image display being capable of being assigned the respective speech commands entered and infrared-encoded signals (FIG. 1).

11 Claims, 4 Drawing Sheets

PROCESS AND DEVICE FOR THE SPEECH-CONTROLLED REMOTE CONTROL OF ELECTRICAL CONSUMERS

BACKGROUND OF THE INVENTION

This invention relates to a method and apparatus for remote controlling electrical consumers by way of speech commands, the following being featured: a standard, commercially available personal computer (PC) serving as the CPU which receives the speech commands, recognizes them and transforms them into control commands for controlling the consumers, a minimum of one speech channel with an electro-acoustic transducer which is connected to the PC via a speech channel interface, and a remote control network which is connected to the CPU and the consumers, in addition to a standard, commercially available speech recognition program being implemented in the PC.

Such a process and a device are known by virtue of the published German Patent application DE 4 214 668 A1.

Standard, commercially available personal computers in the form of economically priced speech communications systems have been offered recently for communication with the computer. The remote control system described in the above-mentioned German Patent application DE 4 214 668 A1 takes advantage of this to generate the control signals required for the remote control of connected electrical consumers with the aid of the speech recognition system implemented in the PC. This process also utilizes a graphic user interface (GUI) on the PC monitor for displaying a code word for calling stored individual settings for the respective electrical consumer.

The citation (DE-A-4 219 106 DEUTSCHE AEROSPACE AG, 16th Dec. 1993, Abstract) pertains to a speech-controlled information and/or ordering system featuring a central computer, the central computer being equipped with a speech recognizer and a central data storage, as well as featuring at least one speech input/speech output device, said device being connected to the central computer by a telephone network. In order to improve the flexibility and efficiency of such a system in the handling of the dialog of the caller with the central computer, this publication suggests that the speech input/speech output device be spatially assigned a display unit which is connected with the central computer for the purpose of visually displaying the information conveyed from the central computer. This speech-controlled information and/or ordering system does not comprise a remote control or telecommand system. Transmission of infrared signals is suggested exclusively for communication between the speech input and output devices, e.g. between a modified telephone terminal device and a display unit.

Many electric household appliances on the market, i.e. consumer electronics units in particular, can be remote-controlled nowadays using a small-sized, easy-to-use remote control unit by means of the transmission of infrared signals to the electric appliance. Such a remote control unit of hi-fi units, for example, incorporates a great variety of different functions, e.g. switchover from stand-by mode to continuous operation, channel selector, loudspeaker volume control, etc. Infrared remote control units of this type have shown themselves to be particularly reliable and not susceptible to malfunction. However, infrared remote control units are designed for operating only a single unit or a group of functionally associated units, and remote control extending through a number of rooms is not possible.

The citation (DATABASE WPIL no. 92-055 708, DERWENT PUBLICATIONS LTD., London; & TP-A-19 201 (ANONYMOUS)) suggests two different systems for a remote control or telecommand system based on infrared signal transmission:

a) A portable, keyless remote control unit transmits infrared or radio remote control signals to electronic equipment, with the remote control commands being entered by way of speech input at the remote control unit rather than by way of keys.

b) The second system suggests a stationary base unit whose functions are the same as those of the remote control unit mentioned above. The stationary base unit is located at a place from which the unit to be remote-controlled is visible. In contrast to the portable version a), the stationary unit is capable of receiving speech commands inputted from a distance, e.g. through the telephone network.

OBJECTS OF THE INVENTION

Therefore, it is an object of the present invention to provide a generic process and a generic system for the speech-controlled remote control of electrical consumers such that the PC serving as the CPU is able to transmit the remote control signals in an interference-free, cost-effective and reliable manner to various appliance types, which may be located in various rooms.

Various other objects, advantages and features of the present invention will become readily apparent from the ensuing detailed description, and the novel features will be particularly pointed out in the appended claims.

SUMMARY OF THE INVENTION

In accordance with this invention, a technique and system for remote controlling electrical consumers in response to speech commands. A PC connected to a remote control network encodes every speech command generated by the speech recognition program in the form of infrared code in accordance with the speech command received, and outputs/transmits the infrared code to the respective target electric consumer via the remote control network. The infrared code received by the respective target electric consumer is then transformed into electrical control signals.

Preferably, the infrared codeset may be entered, modified and assigned to a particular consumer via the PC.

Depending on the specific application of the system embodying the invention for speech-controlled remote control, the remote control network connecting to the individual consumers may feature a star topology or a bus topology.

In addition, the remote control network may also feature a fiberoptic cable via which the infrared control codes may be transmitted directly.

BRIEF DESCRIPTION OF THE DRAWINGS

The following detailed description, given by way of example, and not intended to limit the present invention solely thereto, will best be understood in conjunction with the accompanying drawings in which.

DETAILED DESCRIPTION OF PREFERRED EMBODIMENTS

Figure 1:
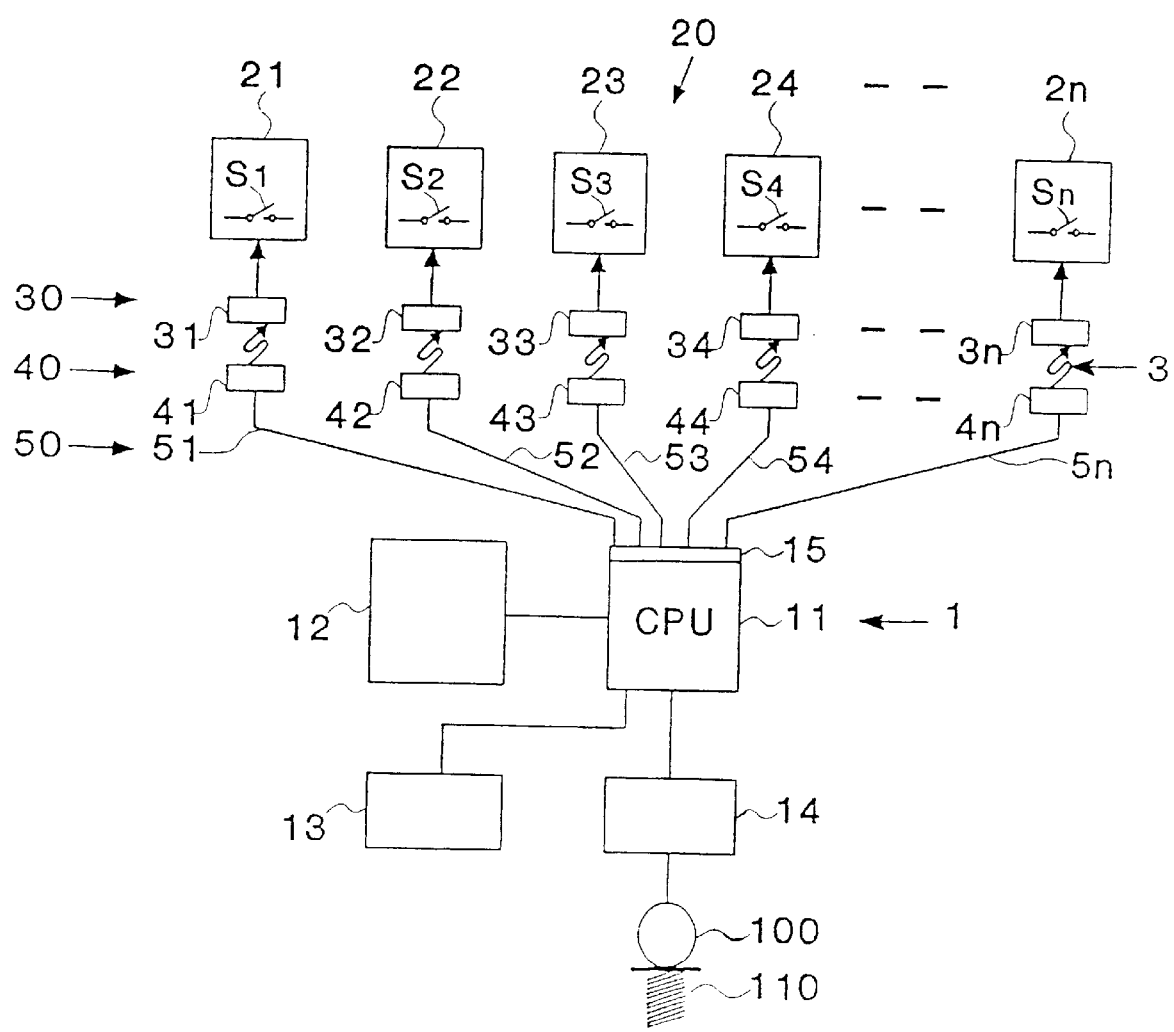
FIG. 1 is a block diagram of a system embodying the invention for the speech-controlled remote control of several consumers featuring a remote control network with a star topology as the first embodiment of the invention.

In the first embodiment as depicted in FIG. 1, an electro-acoustic transducer (100) is connected via a speech channel interface (14) and a remote control network (50) via a remote control interface (15) to a standard PC (1) routinely featuring a CPU (11), a monitor (12) and a keyboard (13). The electro-acoustic transducer (100) defines a speech channel (110). A speech recognition system is implemented in the PC(1), the system recognizing the remote control speech signals transmitted to the electro-acoustic transducer (100) via the speech channel (110) and from there to the CPU via the speech channel interface (14), said system also being capable of conveying the information obtained through speech recognition to other programs. A standard, commercially available software package is preferably implemented for speech recognition. The connection of the remote control network (50) to the remote control interface (15) of the PC (1) features a star topology. This means individual separate wiring systems (51, 52, 53, 54, . . . 5n) are routed to the electro-optical transducers (41, 42, 43, 44, . . . 4n) in a star topology, the transducers transforming the electric infrared-encoded signals transmitted via the wiring systems (51–5n) into optical infrared signals. These infrared signals are conveyed to the infrared receivers (30) via an infrared transmission link (3), the receivers being respectively assigned to the consumers (21, 22, 23, 24, . . . 2n). A switch (S1, S2, S3, S4, . . . Sn) is shown in each of the consumers as the element to be controlled. It goes without saying that the switches depicted as the elements to be controlled only serve as examples, as a great variety of different functions of the respective appliances can be controlled by way of the speech-controlled remote control system described herein.

The first embodiment, which is depicted in FIG. 1, of the speech-controlled remote control system is particularly suitable when a smaller number of consumers located in a few separate rooms are to be remote-controlled. If, however, the number of consumers is larger and if the consumers are distributed over a greater distance, i.e. over several rooms of a building, for example, the effort and expense associated with the cable installation work of the remote control network is considerable. In addition, the remote control network may prove susceptible to malfunction in this case.

Figure 2:
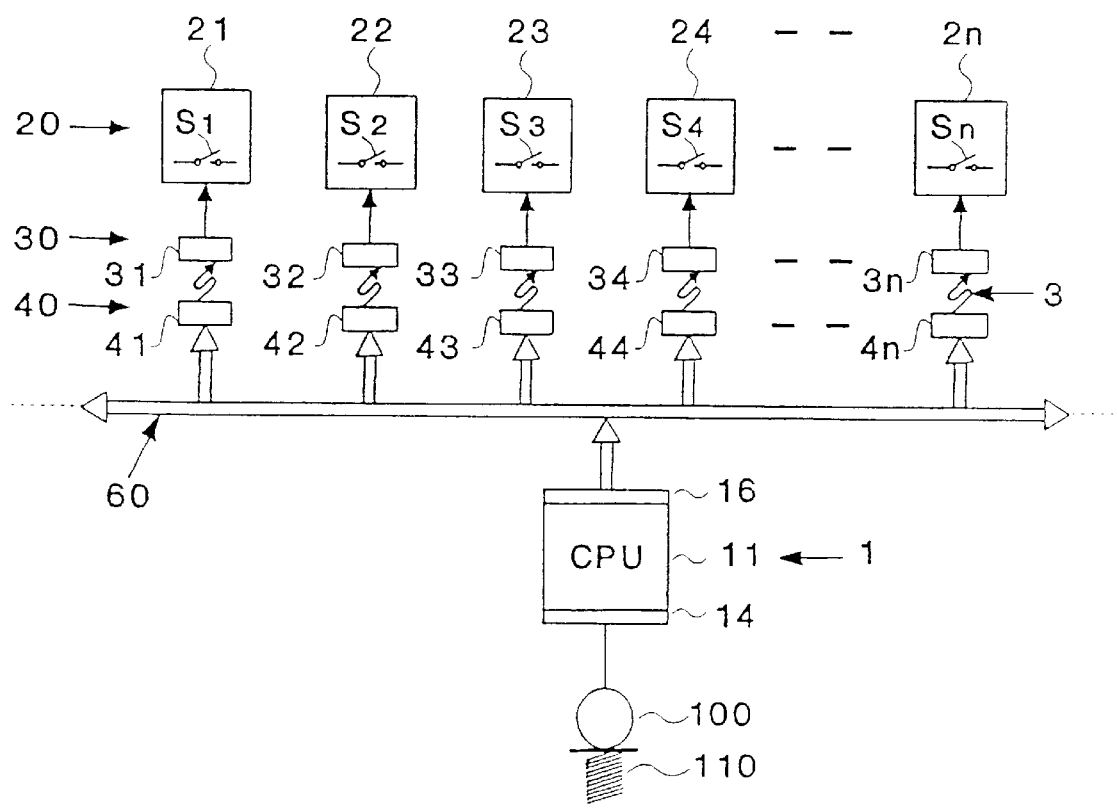
FIG. 2 represents a second embodiment of the system for the speech-controlled remote control of several electrical consumers in which the remote control network features a bus topology.

As an alternative, FIG. 2 shows a second embodiment of the remote control system in which the remote control network features a bus topology. The principal setup of the standard PC (1) in FIG. 2 can be the same as that shown in FIG. 1. The interface (16) leading to the remote control network is a bus interface. The wiring system leading to the individual infrared transmitters (40) is featured as a bus (60). This means that every infrared transmitter (40) has to feature a receiver component for receiving the electric signals transmitted from the PC (1) via the bus (60). The remaining structure of the remote control network with the infrared transmission links (3), the infrared receivers (30) and the cables leading to the individual electrical consumers (20) is identical to the network structure shown in FIG. 1. It goes without saying that a bus topology generally offers the advantage of the cable installation work/expense and the susceptibility to interference of the signals transmitted being less for large-size systems. This is particularly the case when it comes to remote control systems featuring a large number of consumers which may be distributed over a number of rooms within the same building or over several buildings.

Figure 3:
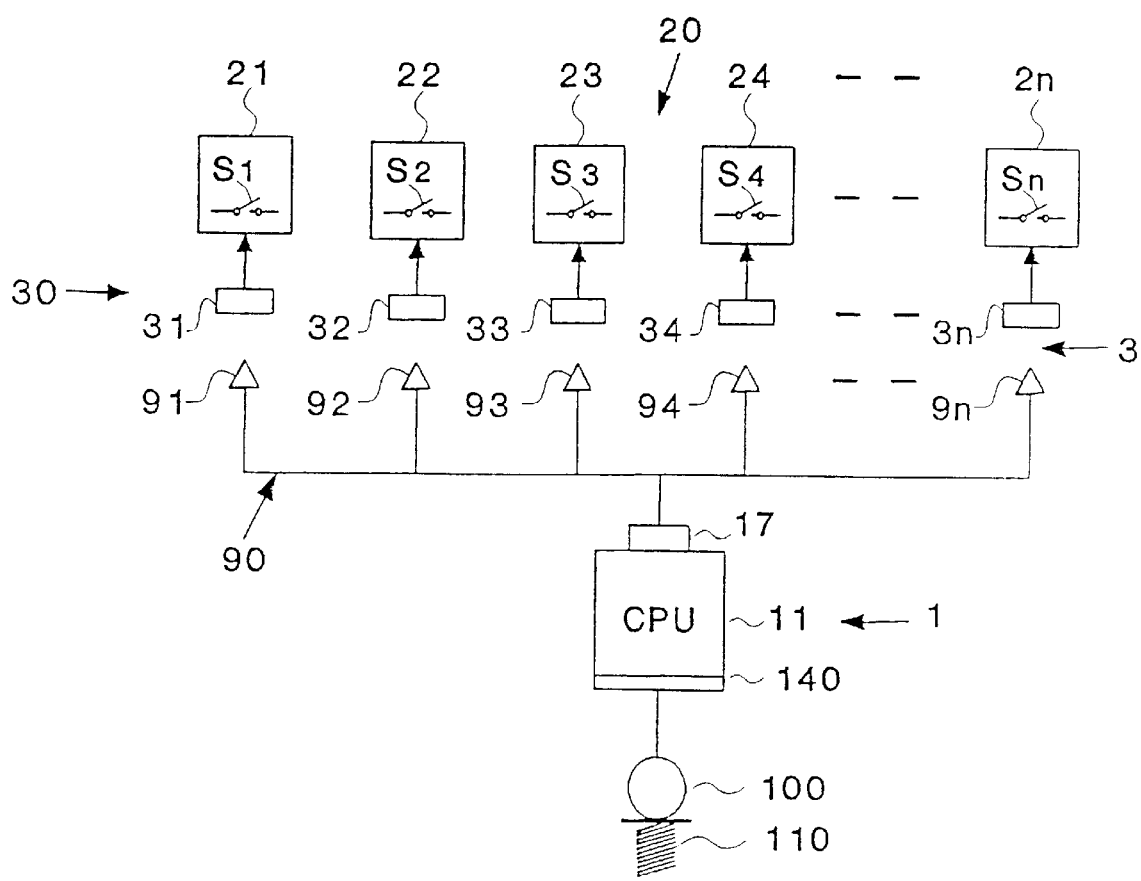
FIG. 3 represents a third embodiment of the system for speech-controlled remote control in which the remote control network provides for the transmission of infrared signals via a fiber-optic cable.

Another variant of the speech-controlled remote control system embodying the invention is depicted in FIG. 3. The setup of the PC (1) is identical to that shown in FIGS. 1 and 2. However, the interface (17) leading to the remote control network contains an infrared transmitter so that the infrared-encoded remote control signals transmitted from the PC (1) via this interface (17) can be transmitted through a fiber-optic cable system (90) directly via infrared terminals (91, 92, 93, 94, . . . 9n) by way of an infrared transmission link to the infrared receivers (31, 32, 33, 34, . . . 3n) assigned to the consumers (20).

Figure 4:
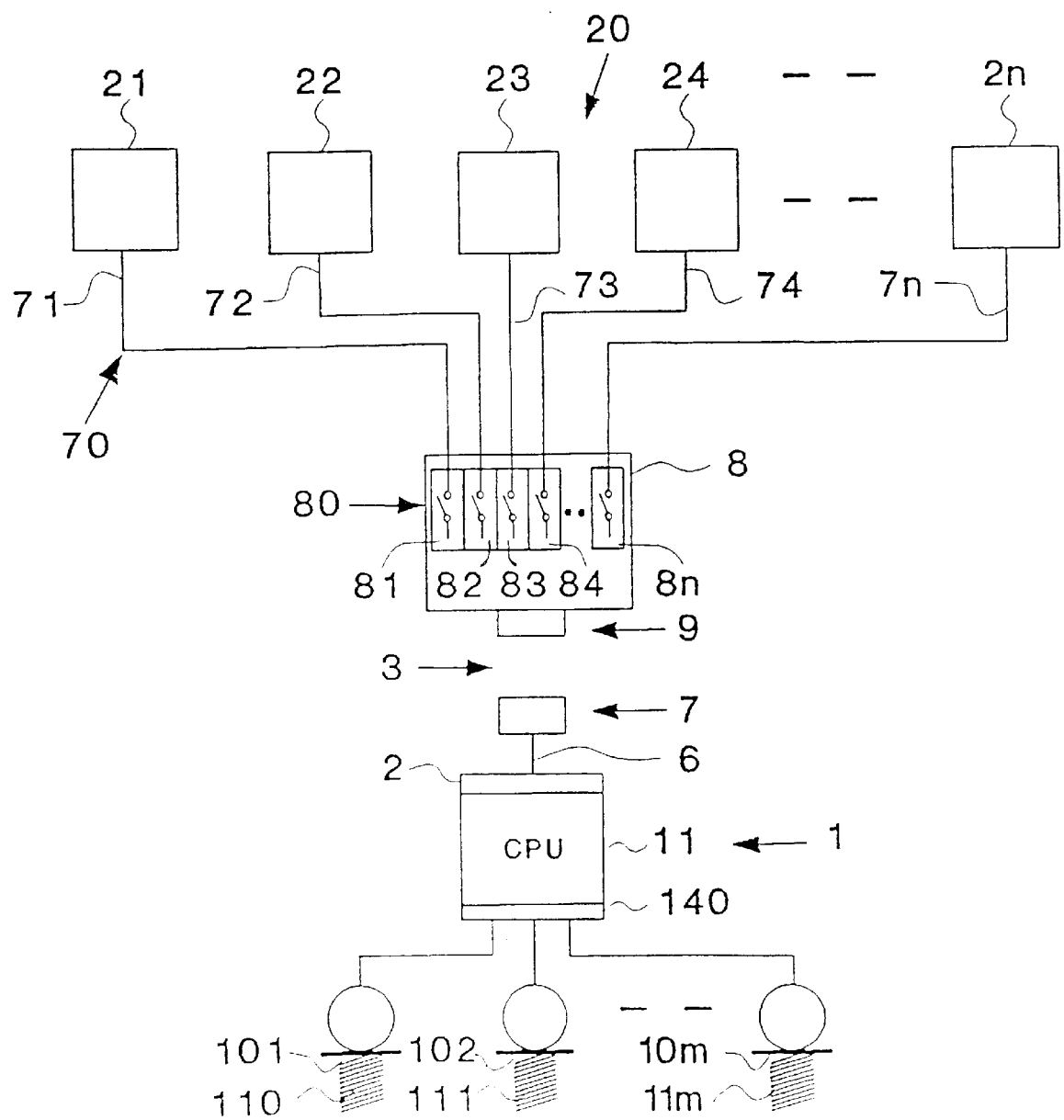
FIG. 4 represents a simplified embodiment of the system for the speech controlled remote control of several consumers in which the consumers are merely switched on and off.

A simplified topology of a speech-controlled remote control system embodying the invention is depicted in FIG. 4. The speech commands entered via the PC (1) here merely serve to switch individual consumers on and off. The speech recognition system implemented in the PC and the infrared codeset stored in the PC are also accordingly simplified in comparison to the embodiments described above. Power supply lines (71, 72, 73, 74, . . . 7n) lead from the individual consumers (20) to the switching contacts (81, 82, 83, 84, . . . 8n) of the all-or-nothing switching relay (80), the switching contacts being preferably provided for in a central switch cabinet (8). A remote control network leads to the central switch cabinet (8) from the PC (1) via an interface (2), the network enabling a simple point-to-point connection in this case. This point-to-point connection consists of an electrical wiring system (6), an electro-optical transducer (7) acting as an infrared transmitter, an infrared transmission link (3) and an infrared receiver (9). The remote control signals conveyed via this simple remote control network act on the all-or-nothing switching relays (80) for the purpose of switching the power supply lines leading to the consumers (2) and individually connected to the switching contacts on and off.

FIG. 4 also shows that several speech channels (110, 111, . . . 11m) can be featured for multi-channel speech input in the PC (1). Of course, the interface (140) has to be designed for accommodating several electro-acoustic transducers (101, 102, . . . 10m). A hierarchy or a priority can also be easily effected among the individual speech channels, e.g. by way of suitable software control.

It goes without saying that the various embodiments of the remote control network as shown in FIGS. 1 to 4 can also provide for parallel as well as serial transmission of the infrared-encoded remote control signals. For example, major switching functions of the individual appliances or units can also be transmitted via separately routed transmission lines of the remote control network in order to enhance the reliability of the transmission of the remote control signals. In the variant shown in FIG. 4, in which several speech channels are featured, the assignment of individual electro-acoustic transducers to the individual electrical consumers being controlled can be of a functional as well as spatial nature. Of course, combinations of the features of the individual embodiments described above can also be realized in the speech-controlled remote control system described herein.

It is appreciated that the standardized infrared codeset may be entered, modified and assigned to a particular consumer via the PC. This advantageously enables a specific codeset to be assigned to each and every consumer, with the codesets possibly differing from one another. Preferably, an image display in the form of a graphic user interface is generated on the PC monitor, then it can be easily assigned to any consumer to be remote-controlled. To be sure, said assignment can be made by way of the respective graphic appearance of this user interface. The respective speech commands entered can be transformed into an infrared codeset upon being recognized and then be graphically assigned to the unit to be controlled on the monitor. Nowadays, standard, commercially available graphic user interfaces routinely enable modifications to the codeset as well as modifications to the form of the graphic user interface itself to be entered by way of commands, e.g. via the keyboard or a mouse. In so doing, the entries made can be stored in a log file. In addition, an acoustic feedback can be generated for the user via the PC's speech output modules.

The PC also preferably processes complex operator control sequences capable of being entered, stored and displayed and which can be carried out at any later time desired in accordance with an accompanying entry.

At the PC, a standard input device such as a keyboard can be used to enter and modify an infrared codeset and assign it to the respective electrical consumer. One or several electro-acoustic transducers can be connected to the speech channel interface of the PC, with several speech channels also being capable of being distributed among several rooms.

Depending on the specific application of the system embodying the invention for speech-controlled remote control, the remote control network connecting to the individual consumers may feature a star topology or a bus topology.

In addition, the remote control network may also feature a fiberoptic cable via which the infrared control codes may be transmitted directly.

A standard, commercially available speech recognition system which is implemented in a standard, commercially available PC is suggested for speech recognition. This speech recognition system can convey the information obtained by way of speech recognition to other programs on the basis of the speech commands entered. This information is captured and compared with the possible remote control commands for controlling the electric consumers. As soon as a command is recognized, the memory is searched for this command, with the information being found, for example, that the radio is to be switched to another radio station in addition to the information, if necessary, indicating the room in which the radio is located. This is followed by the accompanying infrared-encoded signal being transmitted to the respective room and emitted there, this causing the radio to be switched to another radio station.

By virtue of the process and the system embodying the invention it is possible to combine a speech input device with a sequence control in an extremely easy manner. In addition, the method and the system also enable a control sequence to be carried out in a time-delayed manner. For example, the riser can enter a timing sequence before going on vacation and program a sequence control of his choice based on a programmed time for the duration of his absence.

It is appreciated that the PC monitor may be used by the user to check what entries have been made and when they were made at any time.

It is intended that the appended claims be interpreted as including the embodiments discussed above, those various alternatives which have been described and all equivalents thereto.

What is claimed:

1. A method for remote controlling electrical consumer devices in accordance with speech commands, wherein a personal computer (PC) and said consumer devices are connected to a remote control network, comprising the steps of:

receiving speech commands from at least one speech channel having an electro-acoustic transducer, said transducer being connected to the PC via a speech channel interface;

transforming the speech commands into a corresponding control commands for controlling consumer devices using a speech recognition program;

encoding every control command generated by the speech recognition program to provide infrared codes, each infrared code being enterable, modifiable and assignable to a respective consumer device by an operator using the PC;

generating an image display on the PC in the form of a graphic user interface corresponding to each of said consumer devices to be controlled, said interface being assignable to a respective speech command and a codeset;

transmitting said infrared codes to said respective consumer device via the remote control network; and transforming said infrared codes into electrical control signals for controlling the respective consumer device.

2. The method of claim 1, wherein said infrared codes comprises codesets which are assignable to any of said consumer devices.

3. The method of claim 1, further comprising the step of transforming said infrared codes into infrared signals and transmitting said infrared signals to said respective consumer device via the remote control network.

4. The method of claim 1, further comprising the steps of:

storing a sequence of times to transmit each of said infrared codes to said respective consumer device, such that said respective consumer device may be remote controlled in a time-delay manner.

5. A system for remote controlling electrical consumer devices in accordance with speech commands, comprising:

a processor having a speech recognition program for recognizing and transforming the speech commands received by a speech channel into corresponding control command for controlling said consumer devices, said processor having a speech channel interface;

at least one speech channel being connected to said processor via an electro-acoustic transducer and the speech channel interface;

a remote control network connecting said consumer devices to said processor;

an encoder for encoding every speech command generated by said speech recognition program to provide infrared codes;

a transformer for transforming said infrared codes into encoded signals;

a storage device for storing said infrared codes;

an input device for inputting and modifying an infrared code and assigning the modified infrared code to a respective consumer device;

a monitor connected to the processor for displaying an image in the form of a graphic user interface, said graphic user interface being assignable to said respective consumer device;

a transmitter for transmitting the encoded signals to said respective consumer device via the remote control network; and an infrared received associated with said respective consumer device for receiving the encoded signals.

6. The system of claim 5, wherein said processor is a personal computer (PC).

7. The system of claim 5, wherein said infrared code comprises codesets of remote control units of all consumer devices connectable to the remote network.

8. The system of claim 5, wherein speech channels are distributed over several rooms and each speech channel is connected to said processor via an electro-acoustic transducer associated with said each speech channel and said speech channel interface.

9. The system of claim 5, wherein said consumer devices are connected to the remote control network in a star topology.

10. The system of claim 5, wherein said consumer devices are connected to the remote control network in a bus topology.

11. The system of claim 5, wherein said consumer devices are connected to the remote control network by a fiber-optic cable.

\* \* \* \* \*